(12) United States Patent
Kamath et al.

(10) Patent No.: US 11,621,711 B2
(45) Date of Patent: Apr. 4, 2023

(54) LOW AREA AND HIGH SPEED TERMINATION DETECTION CIRCUIT WITH VOLTAGE CLAMPING

(71) Applicant: Texas Instruments Incorporated, Dallas, TX (US)

(72) Inventors: Anant Shankar Kamath, Bangalore (IN); Kanteti Amar, Bangalore (IN); Bharath Kumar Singareddy, Bangalore (IN); Rakesh Hariharan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/374,319

(22) Filed: Jul. 13, 2021

(65) Prior Publication Data
US 2023/0022405 A1   Jan. 26, 2023

(51) Int. Cl.
*H03K 19/00* (2006.01)
(52) U.S. Cl.
CPC ..... *H03K 19/0005* (2013.01); *H03K 19/0013* (2013.01)

(58) Field of Classification Search
None
See application file for complete search history.

(56) References Cited

U.S. PATENT DOCUMENTS

| | | | |
|---|---|---|---|
| 2015/0022183 A1* | 1/2015 | Furtner | G01R 31/66 324/123 R |
| 2020/0169041 A1* | 5/2020 | Liang | H01R 13/641 |

\* cited by examiner

*Primary Examiner* — Jany Richardson
(74) *Attorney, Agent, or Firm* — Valerie M. Davis; Frank D. Cimino

(57) ABSTRACT

Methods, apparatus, systems, and articles of manufacture corresponding to a low area and high speed termination detection circuit with voltage clamping are disclosed. An example apparatus includes a transistor including a first control terminal, first current terminal and a second current terminal, the second current terminal adapted to be coupled to a load. The apparatus further includes a logic gate including an input coupled to the first current terminal. The apparatus further includes a current source including a second control terminal, a third current terminal coupled to a voltage rail and a fourth current terminal coupled to the first current terminal and the input of the logic gate.

19 Claims, 3 Drawing Sheets

LOW AREA AND HIGH SPEED TERMINATION DETECTION CIRCUIT WITH VOLTAGE CLAMPING

FIELD OF THE DISCLOSURE

This disclosure relates generally to circuits, and, more particularly, to a low area and high speed termination detection circuit with voltage clamping.

BACKGROUND

The load resistance (e.g., impedance) of a device may indicate information about the device. For example, a device coupled to a USB port of a computer may have a high load resistance or a low load to indicate information corresponding to the device (e.g., a device type, a protocol version of the device, a communication speed of the device, etc.). A terminal detection circuit is a circuit that is structured to measure the impedance at a pin (e.g., of the USB port) to determine whether the resistance of a load is high (e.g., above a first threshold) or low (e.g., below a second threshold). The termination detection circuit outputs a logical value corresponding to the load resistance to a processor or other component to execute one or more actions based on the value. The terminal detection circuit can provide a value (e.g., logic high, logic low, etc.) corresponding to the determined impedance to a processor or other component. In this manner, the processor or other component may interpret the value to identify the information corresponding to the device. Termination circuits may be implemented in computers, smart phones, laptops, smart televisions, and/or any other electronic device.

BRIEF DESCRIPTION OF THE DRAWINGS

The same reference numbers and other reference designators are used in the drawings to designate the same or similar (functionally and/or structurally) features.

DETAILED DESCRIPTION

Figure 1:
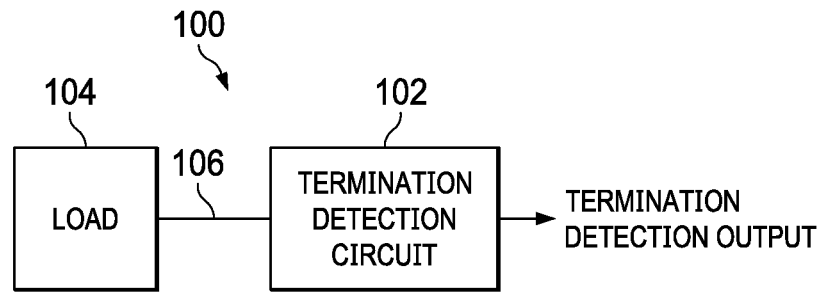
FIG. 1 is a block diagram of an example system including a termination detection circuit described in conjunction with examples disclosed herein.

In some systems (e.g. a system where two devices communicate over a bus or communication port), the impedance of a device (as seen by the other device that it is connected to) may indicate the capabilities of the device. For example, in a system that uses a Universal Serial Bus (USB) to connect a host to a device, the device may have a particular impedance (as seen by the host) which indicates to the host information (e.g. what version of the USB protocol that the device can handle, what speed the device can communicate, power handling capabilities of the device, etc.) by the device. Termination detection circuits are circuits capable of determining whether a load (e.g., one or more devices, components, etc.) has a small resistance or a large resistance. Some termination detection circuits include port voltage clamping to limit the port voltage to a particular range of voltages, even if there is a ground shift between the circuit and the load. The termination detection circuit determines the resistance of the load and outputs a value corresponding to the resistance of the load. In this manner, another device or component can perform one or more actions based on the determination. For example, a device connected to a USB port may correspond to a first load resistance (e.g., a low resistance below a first threshold, below around 150 Ohms, etc.) or a second load resistance (e.g., a high resistance above a second threshold, above around 10K Ohms, etc.), depending on the type of device. In such an example, a terminal detection circuit can determine the load resistance of the device connected to a USB port. In this manner, a processor can determine which type of device is connected to the USB port and perform actions based on the determination.

Some conventional techniques of detecting load resistance involve supplying a constant current and comparing an output voltage to a threshold (thereby indicating the impedance of the device). However, using such techniques, the output voltage increases in the presence of a ground shift (e.g., since the termination detection circuit is connected to one "ground" and the connected device, as referred to herein as a load, is connected to a different "ground," there may be difference in potential between these two "grounds"), which can impact other protocols and resistance detection accuracy. Other conventional termination detection circuits may be structured as closed loop circuits. However, such conventional terminal detection circuits require an internal compensated capacitance to keep the loop stable with respect to a wide range of load capacitances. The compensated capacitance reduces bandwidth, requires more components and/or a larger silicon area to implement, has a long response time, and may cause high overshoots.

Examples disclosed herein provide an open loop-based current comparison detection scheme that is faster, smaller, and requires less power than conventional techniques. Additionally, because examples disclosed herein provide an open loop circuit, there is no need for internal compensated capacitance. Examples disclosed herein include a self-biased n-channel metal oxide field effect transistor (NMOS) transistor whose source terminal is controlled by a resistance of the load. Accordingly, if the output resistance is low (e.g., below a threshold), the current through the transistor (e.g., the drain-to-source current) will increase and, if the output resistance is high (e.g., above a threshold), the current through the transistor will decrease. Examples disclosed herein further includes a current comparison circuit which compares the drain to source current of the transistor with a current from a current source (e.g., a p-channel metal oxide silicon field effect transistor, PMOS). In this manner, if the NMOS current is high (e.g., above a threshold) due to the load resistance, the current comparison circuit will output a first signal and if the NMOS current is low (e.g., due to the load resistance), the current comparison circuit will output a second signal. Additionally, examples disclosed herein include a clamping current sink to clamp the load voltage based on a small load being present (e.g., based on the load resistance being high (e.g., above a threshold)).

FIG. 1 illustrates an example system 100 including an example termination detection circuit 102 and an example load 104. In the example of FIG. 1, the load 104 is connected to the termination detection circuit 102 via an example connection 106. The connection 106 may be a cable (e.g., a USB cable) and/or a bus. The example system 100 may be a computer, a server, an integrated circuit, a system-on-chip, a mobile device, a tablet, and/or any other type of computing device.

The termination detection circuit 102 of FIG. 1 is adapted to and/or structured to couple to the load 104 (e.g., an output device, component, a peripheral device, etc.) via the example connection 106 and output (for example, to a processor, logic circuitry, and/or other analog circuitry or digital circuitry) a value corresponding to the resistance of the load 104. For example, the termination detection circuit 102 outputs a first value (e.g., logic value '1', 5 volts (V), logic high, etc.) based on the resistance of the load 104 being low (e.g., below a first threshold) and outputs a second value (e.g., logic value '0', 0V, logic low, etc.) based on the resistance of the load 104 being high (e.g., above a second threshold). The thresholds corresponding to the low resistance and/or the high resistance may be based on the characteristics of the example termination detection circuit 102 and can be modified. For example, if a user and/or manufacturer prefers that the termination detection circuit 102 detect whether the load has a resistance below a first value (e.g., 100 Ohms, 200 Ohms, 10 Ohms etc.) or based on the load having a resistance above a second value (e.g., 10K Ohm, 20 K Ohm, etc.), the amount of current supplied by current sources, and/or the characteristics of the transistors can be adjusted to satisfy the user and/or manufacturer preferences. The value representative of the load resistance can be transmitted to a processor, controller, and/or any other device. In this manner, the processor, controller, and/or any other device can make a decision or take an action based on the load resistance. For example, if the load 104 corresponds to a temperature dependent resistor, the processor, controller, and/or other device can obtain the value from the termination detection circuit 102 to determine whether the temperature near the temperature dependent resistor is high or low. In other examples the termination detection circuit 102 may be adapted to and/or structured to be coupled to a port. In such examples, an external device (e.g., USB device, such as a keyboard, a mouth, a camera, etc.) may be connected to the port. In such examples, the resistance of the load 104 may correspond to the type of external device that is connected to the port (e.g., a mouse may correspond to a small load resistance and a keyboard may correspond to a large load resistance). In this manner, a processor, controller, and/or other device can determine which type of device is connected to the port based on the value output by the termination detection circuit 102 (e.g., the value representative of the load resistance). The example termination detection circuit 102 is an open loped based comparison detection circuit. Accordingly, the example termination detection circuit 102 is faster, is less complex, has a faster response time, has less components, and requires less silicon area than conventional termination detection circuits. An example circuit implementation of the termination detection circuit 102 is further shown below in conjunction with FIG. 2. Furthermore, in other examples, more than two thresholds may be utilized and the impedance detection may involve detecting impedance in multiple gradations/regions.

Figure 2:
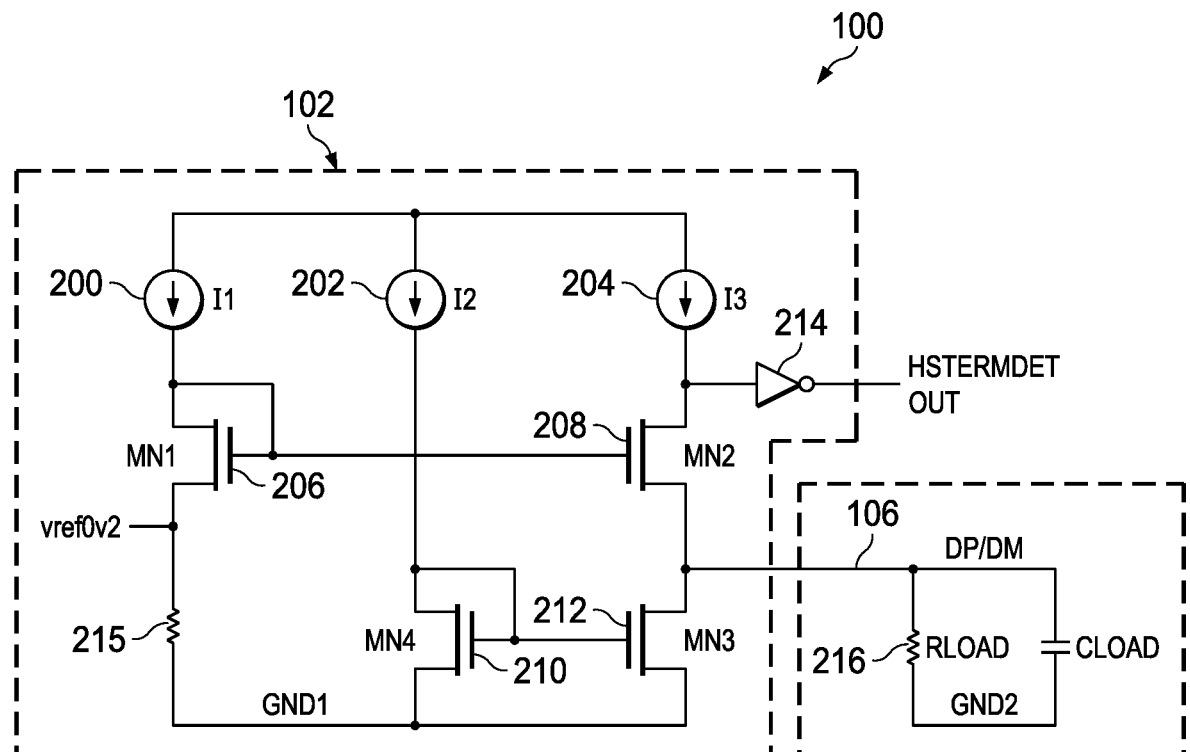
FIG. 2 is a circuit diagram of an example circuit to implement the termination detection circuit of FIG. 1.

FIG. 2 is an example circuit implementation of the example system 100 of FIG. 1. The example system 100 includes the example termination detection circuit 102 and the example load 104 of FIG. 1. The example termination detection circuit 102 includes example current sources 200, 202 and 204; example n-channel transistors (e.g., metal oxide semiconductor (NMOS) field effect transistors (FETs)) 206, 208, 210 and 212; the example logic gate 214 and an example resistor 215. The example load 104 includes an example load resistance 216.

The example current sources 200-204 of FIG. 2 provide (e.g., supply) current to the drain terminals (e.g., current terminals) of the respective NMOS transistors 206-210. In some examples, the current sources 200-204 may be implemented as PMOS transistors adapted to and/or structured to act as current sources. In such examples, the source terminals (e.g., current terminals) of the current sources 200-204 are coupled to a supply voltage (e.g., a voltage supply, a positive voltage rail, etc.), the gate terminals (e.g., the control terminals) of the current sources 200-204 are coupled to each other, and the drain terminals (e.g., current terminals) of the current sources 200-204 are coupled to the respective drain terminals of the NMOS transistors 206-210. Additionally or alternatively, one or more of the example current sources 200-204 could be implemented using NMOS transistor and/or any other type of current source. The current terminal (e.g., drain terminal, if implemented by a PMOS) of the example current source 200 is coupled to the gate terminals (e.g., control terminals) of the example MOSFETs 206, 208 to bias the gates of the MOSFETs 206, 208 to turn the MOSFETs 206, 208 on. Likewise, the current terminal (e.g., drain terminal, if implemented by a PMOS) of the example current source 202 is coupled to the gate terminals (e.g., control terminals) of the example MOSFETs 210, 212 to bias the gates of the MOSFETs 210, 212 to turn the MOSFETs 210, 212 on. Additionally, the current terminal (e.g., drain terminal, if implemented by a PMOS) of the current source 204 is coupled to an input terminal of the example logic gate 214.

The example NMOS transistors 206-212 of FIG. 2 facilitate the determination of the resistance of the load resistance 216 based on voltage and/or current at the input of the example logic gate 214 and clamp the output voltage. The drain-to-source current through the respective NMOSs 206-212 is proportional to $$\frac{(V_{gs} - V_T)^2}{2} * k$$

(e.g., based on the NMOS 206-212 operating in saturation mode), where Vgs is the voltage difference between the gate terminal and the source terminal of the NMOS 208, Vt is the threshold voltage of the NMOS 208 and k is a constant.

The NMOS 206 of FIG. 2 biases the gate terminal of the NMOS 208 such that if the load voltage (e.g., the voltage at the DP/DM node) is set to a clamped voltage value, and the drain-to-source current of the NMOS 208 corresponds to the current supplied by the current source 200. The first current terminal (e.g., drain terminal) of the example NMOS 206 is coupled to the current source 200 and the control terminals (e.g., gate terminals) of the example NMOS 206 and the example NMOS 208. The control terminal (e.g., gate terminal) of the example NMOS 206 is coupled to the current source 200, the first current terminal of the NMOS 206 and the control terminal of the example NMOS 208. The second current terminal (e.g., source terminal) of the NMOS 206 is coupled to ground/a ground node (e.g., the first ground node (GND1)) (e.g., via the example resistor 215) and to a reference voltage input signal, vref0v2 (e.g., the reference voltage used to set the thresholds discussed below).

The example NMOS 208 of FIG. 2 is a self-biased transistor that can be used as a voltage controlled current source. The first current terminal (e.g., drain terminal) of the example NMOS 208 is coupled to the current source 204 and the logic gate 214. The control terminal (e.g., gate terminal) of the example NMOS 208 is coupled to the control terminal of the example NMOS 206 and the current source 200. The second current terminal (e.g., source terminal) of the NMOS 208 is coupled to the first current terminal (e.g., drain terminal) of the example MOSFET 212 and is adapted to and/or structured to be coupled to the example load 104 via an output terminal and/or the example connection 106.

The example NMOS 210 of FIG. 2 biases the gate terminal of the example NMOS 212. The first current terminal (e.g., drain terminal) of the example NMOS 210 is coupled to the current source 202 and the control terminals (e.g., gate terminals) of the example NMOS 210 and the example NMOS 212. The control terminal (e.g., gate terminal) of the example NMOS 210 is coupled to the current source 202, the first current terminal of the NMOS 210 and the control terminal of the example NMOS 212. The second current terminal (e.g., source terminal) of the NMOS 210 is coupled to the first ground (the GND1 node).

The example NMOS 212 of FIG. 2 clamps the voltage at the DP/DM node. The first current terminal (e.g., drain terminal) of the example NMOS 212 is coupled to the second current terminal of the NMOS 208 and is adapted to and/or structured to be coupled to the load 104. The control terminal (e.g., gate terminal) of the example NMOS 212 is coupled to the control terminal of the example NMOS 210 and the current source 202. The second current terminal (e.g., source terminal) of the NMOS 212 is coupled to the first ground (the GND1 node).

In the example of FIG. 2, the example circuit 214 (e.g. a logic gate, an inverter, a buffer, an operational amplifier or a comparator) compares the voltage and/or current at the input to a threshold and outputs a result based on whether the voltage and/or current is higher or lower than the threshold. For example, the circuit 214 obtains a voltage and/or current and outputs a logic high (e.g., '1', 5V, the voltage supply, etc.), based on the input voltage and/or current being low (e.g., below a threshold) and outputs a logic low (e.g., '0', 0 V, ground, etc.) based on the input voltage and/or current being high (e.g., above the threshold). In some examples, the circuit 214 can be a buffer that obtains a voltage and/or current and outputs a logic high (e.g., '1', 5V, the voltage supply, etc.), based on the input voltage and/or current being high (e.g., above a threshold). Additionally, the circuit 214 implemented as a buffer outputs a logic low (e.g., '0', 0 V, ground, etc.) based on the input voltage and/or current being low (e.g., below the threshold). In some examples, the circuit 214 can be replaced with a comparator (e.g., with a first input corresponding to the input of the circuit 214 and a second input coupled to a reference voltage corresponding to the threshold) and/or a comparator and an inverter. In this manner, the comparator can output a logic signal (e.g., a voltage) corresponding to the voltage and/or current at the input terminal. The output of the circuit 214 is the hsterm_out node that is adapted to and/or structured to be coupled to a processor, controller, or other device/component.

The example load resistance 216 of FIG. 2 is representative of the resistance of the load 104. Accordingly, the resistance 216 may be a low resistance (e.g., below a first threshold such as approximately 100 Ohms) and/or may be a high resistance (e.g., above a second threshold, such as approximately 14K Ohms), depending on the characteristics of the load 104. The first threshold and second threshold may be set to any resistance (or, in other examples, the thresholds may be set based on voltages or currents that correspond to particular resistances) based on the characteristics of the components. For example, one or more of the example components 200-215 can be selected (e.g., based on the characteristics of the components) to correspond to a particular low resistance threshold and a particular high resistance threshold. Additionally, one or more or the example components 200-215 can be selected to correspond to a maximum load voltage (e.g., approximately 200 mV) seen at the DP/DM node of the example load 104. The current drawn by the load (e.g., the current though the example resistance 216) is based on the output voltage, a difference between the first ground of the termination detection circuit 102 and the second ground of the load 104 and the example load resistance 216 (e.g., $$I_{load} = \frac{Voutput - \Delta GND}{rload},$$

where 66 GND is the difference between the two grounds). As an example, if the user/manufacturer desires a maximum output voltage of approximately 200 mV and a determination of a load resistance greater than approximately 14K Ohms or less than approximately 100 Ohms, the maximum load current for a 14K Ohms load resistance should be 23 uA (e.g., 325 mV/14K=23 uA) and the minimum load current for a 100 Ohms load resistance should be approximately 750 uA (e.g., 75 mV/100=750 uA). Accordingly, the user and/or manufacturer can select a current for the example current source 204 to output between 23 uA and 750 uA (e.g., approximately 60 uA), so that the drain-to-source current is above the current needed for the 100 Ohm resistance and below the current needed for the approximately 14K Ohm resistance, as further described below. Alternatively, a different amount of current can be used for the current source 204 based on different output voltage and resistance determination preferences.

During operation, if the voltage for the load 104 (e.g., the voltage at the DP/DM node) is set to approximately 0.2 V and the load resistance is low (e.g., approximately 100 Ohms), the load current should be high (e.g., above a threshold) (e.g., 0.2 V/100 Ohm=2 milliamps (mA)). In this manner, the current source 204 and/or the drain-to-source current of the NMOS 208 needs to supply a high current (e.g., approximately 2 mA) to the load resistance 216 so that the load voltage can reach the approximately 0.2 V desired load voltage. The current source 204 may be only capable of outputting a current (e.g., approximately 80 microamps (uA)) much lower than the desired high current. Thus, the load voltage at the DP/DM node will only reach a low voltage (e.g., approximately 8 mV). Because the load voltage (e.g., the voltage at the source of the NMOS 208) is reduced to a low voltage, the Vgs of the NMOS 208 increases to an amount high enough to cause the NMOS 208 to operate in triode mode (e.g., Vds<Vgs−Vt). Accordingly, the drain-to-source current of the NMOS 208 increases (e.g., by an amount proportional to the increase in the Vgs) to an amount above the current supplied by the current source 204. Because the example NMOS 208 operates triode mode while the current source 204 operates in saturation mode, the voltage at the input of the circuit 214 transitions to a low voltage and/or the current at the input of the circuit 214 transitions to a negative current. Thus, because the input of the circuit 214 is low, the output of the circuit 214 will be high (e.g., the signal hsterm_out of the termination detection circuit 102 will be "high").

If the voltage for the load 104 (e.g., at the DP/DM voltage) is set to approximately 0.2 V and the load resistance is high (e.g., approximately 14K Ohms), the output current should be low (e.g., 0.2 V/14K Ohm=14 uA). In this manner, the current source 204 and/or the drain-to-source current of the NMOS 208 needs to supply a low current (e.g., approximately 14 uA) to the load resistance 216 so that the load voltage can reach the 0.2 V desired load voltage. However, because the current source 204 is only capable of outputting a preset amount of current that may be higher than the low current (e.g., approximately 80 uA), then the load voltage at the DP/DM node will increase to a higher voltage (e.g., at or above approximately 0.2 V). Because the load voltage (e.g., the voltage at the source of the NMOS 208 and the DP/DM node) is increased to a higher voltage, the Vgs of the NMOS 208 decreases to an amount low enough to cause the NMOS 208 to operate in saturation mode (e.g., Vds>Vgs−Vt). Accordingly, the drain-to-source current of the NMOS 208 decreases (e.g., by an amount proportional to the increase in the Vgs) to an amount below the current supplied by the current source 204. Additionally, because the drain-to-source current of the NMOS 208 decreases, the voltage at the source of the current source 205 decreases. In this manner, the Vsg of the current source 204 decreases which causes the current source 204 to operate in the triode mode (e.g., Vsd≤Vsg−|Vt|) while the NMOS 208 operates in the saturation mode. Thus, the voltage at the drain of the NMOS 208 and the input of the circuit 214 transitions to a high voltage (e.g., above a threshold) (in some examples this may also cause the current at the input of the circuit 214 transitions to a positive current). Thus, because the input of the circuit 214 is high (e.g., above a voltage threshold), the output of the circuit 214 will be low (e.g., the signal hsterm_out of the termination detection circuit 102 will be "low").

As described above, if the load resistance 216 is high, the voltage at the DP/DM node increases. Accordingly, to cap the voltage at the DP/DM node to a particular voltage (e.g., approximately 0.2 V), the example NMOSs 210, 212 mitigate the increasing voltage to help cap the voltage at the DP/DM voltage to the particular voltage. For example, the current at the drain terminal of the NMOS 212 may be similar to the current at the drain of the example NMOS 210 (e.g., corresponding to the current supplied by the current source 202). Accordingly, based on the load resistance 216 being high, the example NMOS 212 can pull some of the drain-to-source current of the NMOS 208 toward ground, thereby reducing the load current and reducing the load voltage. Accordingly, the NMOS 212 helps to cap the load voltage (e.g., the voltage at the DP/DM node) to a preset voltage.

Figure 3:
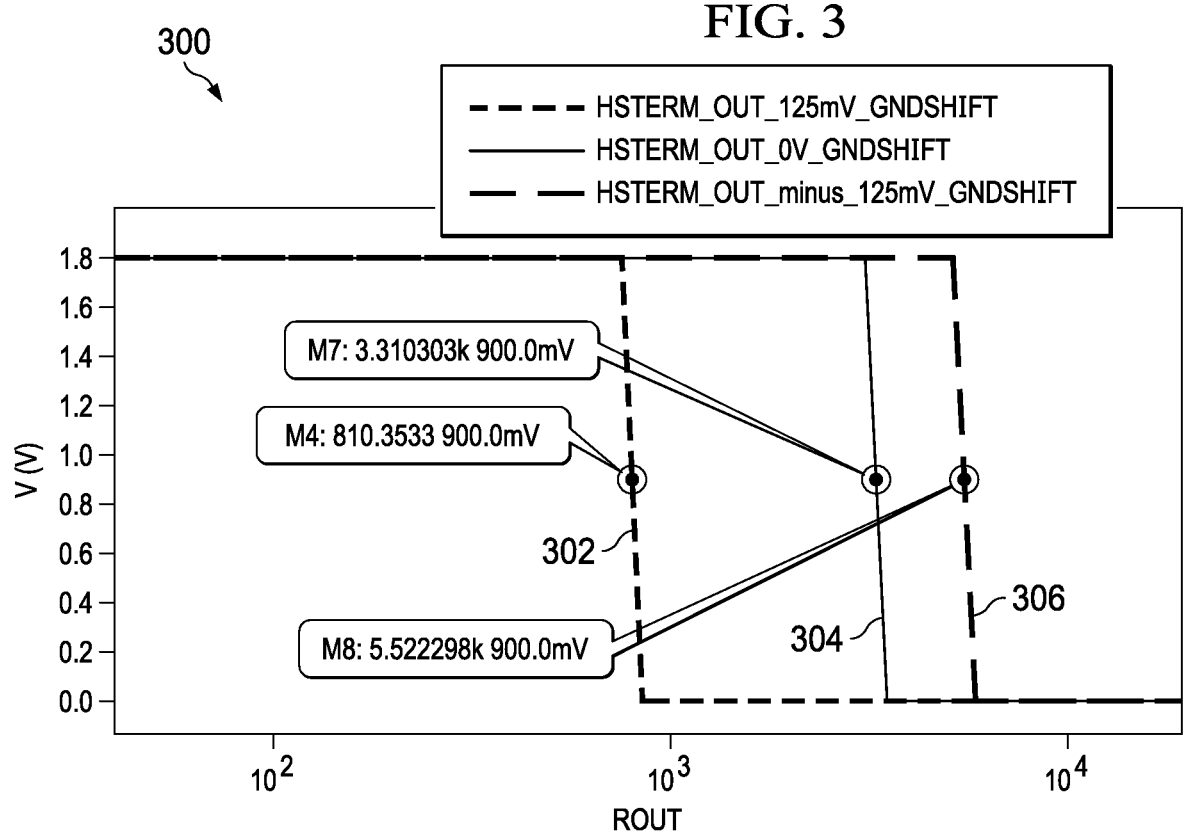
FIG. 3 illustrates a graph corresponding to the output of the example termination detection circuit of FIGS. 1 and/or 2 based on different load resistances.

FIG. 3 is an example graph 300 that illustrates the output of the example termination detection circuit 102 based on different load resistances with respect to different differences in ground (e.g., the voltage at the first ground node minus the voltage at the second ground node, GND1−GND2). Graph 300 includes an x-axis representing the load resistance, such as resistance 216, (in Ohms) and a y-axis representing the hstermdet_out signal (in volts). The graph 300 includes an example first plot 302, an example second plot 304, and an example third plot 306. The example plots 302, 304, 306 corresponds to a maximum output voltage of approximately 200 mV and a determination of a load resistance greater than approximately 14K Ohms or less than approximately 100 Ohms.

The first plot 302 of FIG. 3 corresponds to the voltage at the hstermdet_out node of the example termination detection circuit 102 with respect to the load resistance 216 based on an approximately 125 mV GND difference (e.g., GND1−GND2=125 mV). As shown in the first plot 302, in response to the load resistance 216 (e.g., shown in the x-axis) being below approximately 810 Ohms, the voltage at the hstermdet_out node is high (e.g., approximately 1.8 V). However, after the load resistance 216 is above approximately 810 Ohms, the voltage at the hstermdet_out node transitions to a low value (e.g., approximately 0V). Accordingly, a high voltage at the hstermdet_out node corresponds to a low load resistance 216 (e.g., below approximately 810 Ohms) and a low voltage at the hstermdet_out node corresponds to a high load resistance 216 (e.g., above approximately 810 Ohms).

The second plot 304 of FIG. 3 corresponds to the voltage at the hstermdet_out node of the example termination detection circuit 102 with respect to the load resistance 216 based on an approximately 0 mV GND difference (e.g., GND1−GND2=0 V). As shown in the first plot 304, in response to the load resistance 216 (e.g., shown in the x-axis) being below approximately 3.3K Ohms, the voltage of the hstermdet_out signal is high (e.g., approximately 1.8 V). However, if the load resistance 216 is above approximately 3.3K Ohms, the voltage of the hstermdet_out signal is low (e.g., approximately 0V). Accordingly, a high voltage of the hstermdet_out signal corresponds to a low load resistance 216 (e.g., below approximately 3.3K Ohms) and a low voltage of the hstermdet_out signal corresponds to a high load resistance 216 (e.g., above approximately 3.3K Ohms).

The first plot 306 of FIG. 3 corresponds to the voltage at the hstermdet_out node of the example termination detection circuit 102 with respect to the load resistance 216 based on an approximately −125 mV GND difference (e.g., GND1−GND2=−125 mV). In response to the load resistance 216 (e.g., shown in the x-axis) being below approximately 5.5K Ohms, the voltage of the hstermdet_out signal is high (e.g., approximately 1.8 V). However, after the load resistance 216 is above approximately 5.5K Ohms, the voltage of the hstermdet_out signal is low (e.g., approximately 0V). Accordingly, a high voltage of the hstermdet_out signal corresponds to a low load resistance 216 (e.g., below approximately 5.5K Ohms) and a low voltage for the hstermdet_out signal corresponds to a high load resistance 216 (e.g., above approximately 5.5K Ohms). Accordingly, the example graph 300 of FIG. 3 illustrates that even within a 250 mV range difference between the ground potentials between the termination detection circuit 102 and the load 104, the example termination detection circuit 102 can output a high voltage for a 100 Ohm load resistance and output a low voltage for a 14K Ohm load resistance.

Figure 4:
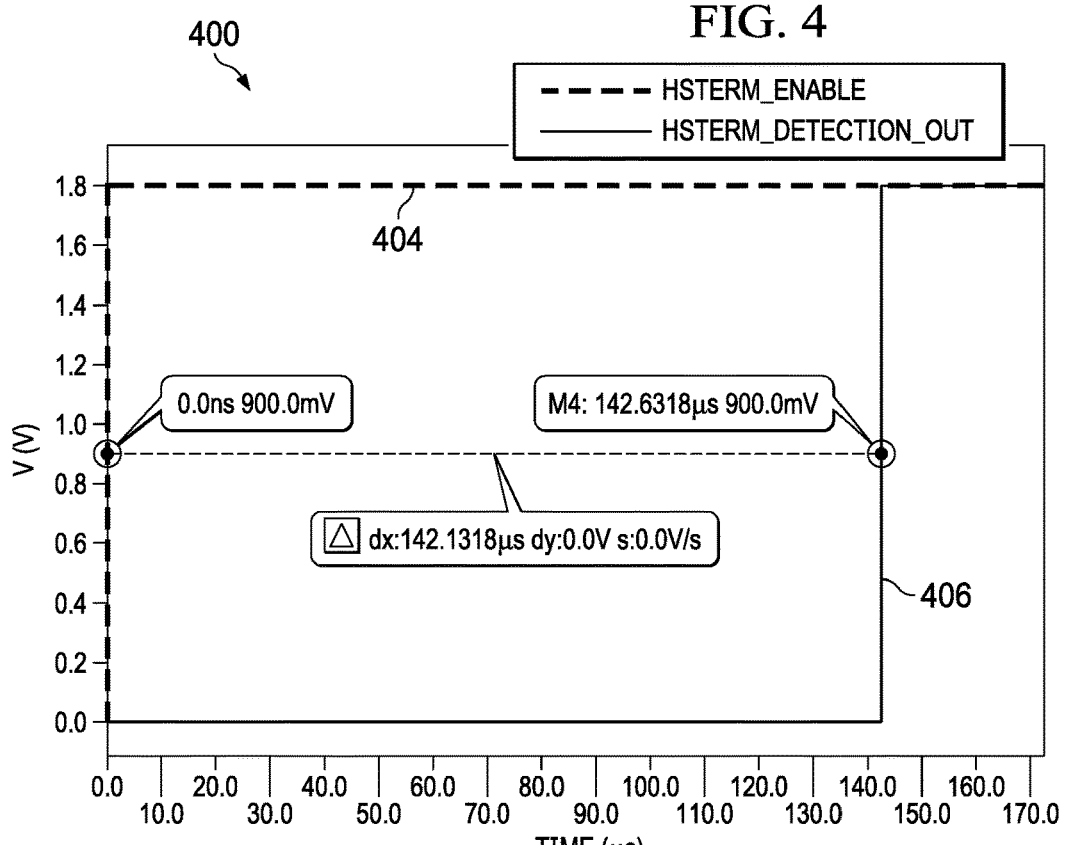
FIG. 4 illustrates graphs corresponding to a comparison of response time of examples disclosed herein to conventional techniques.
Figure 4:
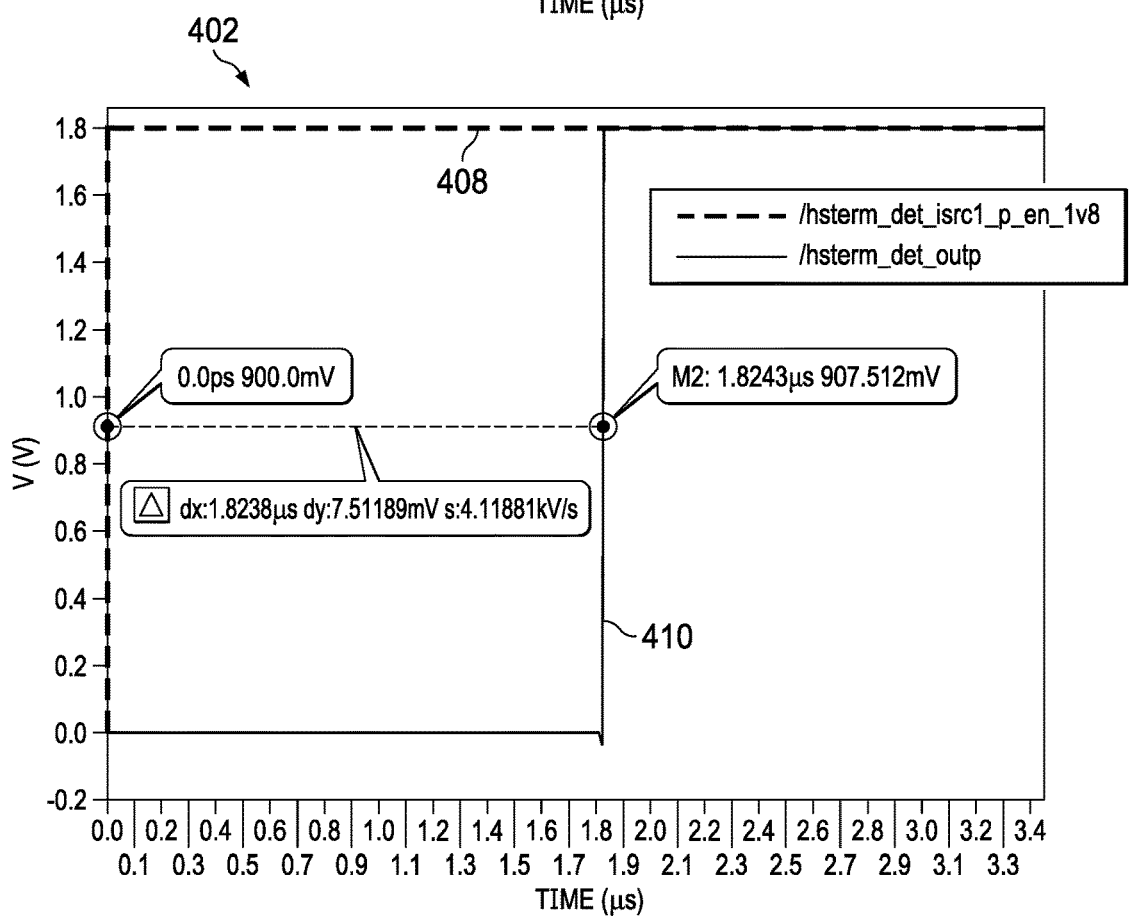

FIG. 4 illustrates a comparison of the Hsterm detection output enable time of a conventional termination circuit (plots 404 and 406) to the example termination detection circuit 102 of FIGS. 1-2 (plots 408 and 410). The x-axis of FIG. 4 represents time in us and the y-axis represents the voltage used to power the termination detection circuit 102 and the voltage output by the termination detection circuit 102 in volts. FIG. 4 includes an example conventional timing diagram 400 and an example timing diagram 402 corresponding to the termination detection circuit 102 of FIGS. 1-2. The conventional timing diagram 400 includes an example enable plot 404 and an example load resistance detection plot 406. The timing diagram 402 of FIG. 4 corresponds to the termination detection circuit 102 and includes an example enable plot 408 and an example load resistance detection plot 410. The example enable plots 404, 408 correspond to when the termination detection circuit 102 is enabled (e.g., powered up).

The first example timing diagram 400 of FIG. 4 corresponds to a conventional technique where constant current is supplied to the load and compared to a voltage or to a conventional technique where the output voltage is clamped and the current is compared in a closed loop structure. As shown in the first example timing diagram 400, the conventional technique takes approximately 132.1 microseconds (us) to detect a load resistance from startup (e.g., from the rising edge of the enable plot 404 to the rising edge of the load resistance detection plot 406). However, as shown in the example timing diagram 402, the example terminal detection circuit 102 is capable of detecting the load resistance in approximately 1.8 us (e.g., from the rising edge of the enable plot 404 to the rising edge of the load resistance detection plot 406). Accordingly, not only does the example termination detection circuit 102 correspond to a smaller, less complex circuit, the example termination detection circuit 102 is faster and has a faster response time than conventional technique.

While an example manner of implementing the termination detection circuit 102 of FIG. 1 is illustrated in FIG. 2, one or more of the elements, processes and/or devices illustrated in FIGS. 2 and/or 3 may be combined, divided, re-arranged, omitted, eliminated and/or implemented in any other way. Further, the example components 200-215, and/or more generally, the example termination detection circuit 102 of FIGS. 1-2 may be implemented by hardware, software, firmware and/or any combination of hardware, software and/or firmware. Thus, for example, any of the example components 200-215, and/or more generally, the example termination detection circuit 102 of FIGS. 1-2 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example components 200-215, and/or more generally, the example termination detection circuit 102 of FIGS. 1-2 is/are hereby expressly defined to include a non-transitory computer readable storage device or storage disk such as a memory, a digital versatile disk (DVD), a compact disk (CD), a Blu-ray disk, etc. including the software and/or firmware. Further still, the example termination detection circuit 102 of FIGS. 1 and/or 2 may include one or more elements, processes and/or devices in addition to, or instead of, those illustrated in FIGS. 1 and/or 2, and/or may include more than one of any or all of the illustrated elements, processes, and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

"Including" and "comprising" (and all forms and tenses thereof) are open ended terms. Thus, whenever a claim employs any form of "include" or "comprise" (e.g., comprises, includes, comprising, including, having, etc.) as a preamble or within a claim recitation of any kind, additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" refers to implementations including any of (1) at least one A, (2) at least one B, and (3) at least one A and at least one B. Similarly, as used herein in the context of describing structures, components, items, objects and/or things, the phrase "at least one of A or B" refers to implementations including any of (1) at least one A, (2) at least one B, and (3) at least one A and at least one B. As used herein in the context of describing the performance or execution of processes, instructions, actions, activities and/or steps, the phrase "at least one of A and B" refers to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" refers to implementations including any of (1) at least one A, (2) at least one B, and (3) at least one A and at least one B.

From the foregoing, it will be appreciated that example methods, apparatus, systems, and articles of manufacture corresponding to a low area and high speed termination detection circuit with voltage clamping are disclosed. The disclosed examples corresponding to faster terminal detection circuit with a quicker response time, less components, less power consumption, without overshoots, and taking up a smaller silicon area than conventional terminal detection circuits. Examples disclosed herein result in a 30% area reduction and 20% power savings from conventional train detection circuits.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

Various forms of the term "couple" are used throughout the specification. These terms may cover connections, communications, or signal paths that enable a functional relationship consistent with the description of the present disclosure. For example, if device A generates a signal to control device B to perform an action, in a first example device, A is coupled to device B by direct connection, or in a second example device, A is coupled to device B through intervening component C if intervening component C does not alter the functional relationship between device A and device B such that device B is controlled by device A via the control signal generated by device A.

Consistent with the present disclosure, the term "configured to" describes the structural and functional characteristics of one or more tangible non-transitory components. For example, a device that is "configured to" perform a function mean that the device has a particular configuration that is designed or dedicated for performing a certain function. A device is "configured to" perform a certain function if such a device includes tangible non-transitory components that can be enabled, activated, or powered to perform that certain function. While the term "configured to" may encompass being configurable, this term is not limited to such a narrow definition. Thus, when used for describing a device, the term "configured to" does not require the described device to be configurable at any given point of time.

Moreover, the term "example" is used herein to mean serving as an instance, illustration, etc., and not necessarily as advantageous. Also, although the disclosure has been shown and described with respect to one or more implementations, equivalent alterations and modifications will be apparent upon a reading and understanding of this specification and the annexed drawings. All such modifications and alterations are fully supported by the disclosure and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in an example particular order, this does not require that such operations be performed in the example particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above does not require such separation in all embodiments.

Descriptors "first," "second," "third," etc. are used herein when identifying multiple elements or components which may be referred to separately. Unless otherwise specified or understood based on their context of use, such descriptors do not impute any meaning of priority, physical order, or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead. For example, a p-type metal-oxide-silicon FET ("MOSFET") may be used in place of an n-type MOSFET with little or no changes to the circuit. Furthermore, other types of transistors may be used (such as bipolar junction transistors (BJTs)).

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

The following claims are hereby incorporated into this Detailed Description by this reference, with each claim standing on its own as a separate embodiment of the present disclosure.

What is claimed is:

1. An apparatus comprising:
   a first transistor including a first control terminal, first current terminal and a second current terminal, the second current terminal adapted to be coupled to a load;
   a logic gate including an input coupled to the first current terminal;
   a current source including a second control terminal, a third current terminal coupled to a voltage rail and a fourth current terminal coupled to the first current terminal and the input of the logic gate; and
   a second transistor including a third control terminal, a fifth current terminal coupled to a ground node via a resistor, and a sixth current terminal coupled to the third control terminal and the first current terminal.

2. The apparatus of claim 1, wherein the current source is a first current source, further including a second current source coupled to (a) the third control terminal, (b) the first control terminal, and (c) the sixth current terminal.

3. The apparatus of claim 2, wherein the second current source includes a fourth control terminal coupled to the second control terminal.

4. The apparatus of claim 2, wherein the first and second transistors are n-channel transistors and the first and second current sources are p-channel transistors.

5. The apparatus of claim 1, wherein the transistor is a first transistor, further including a second transistor including a third control terminal, a fifth current terminal coupled to the second current terminal, and a sixth current terminal coupled to a ground node.

6. The apparatus of claim 5, further including:
a third transistor including a seventh current terminal, an eighth current terminal coupled to the ground node, and a fourth control terminal coupled to the seventh current terminal and the third control terminal; and
a fourth transistor including a ninth current terminal coupled to the voltage rail and the seventh current terminal, the fourth control terminal, and the third control terminal.

7. The apparatus of claim 1, wherein the logic gate includes an output adapted to be coupled to at least one of a processor, logic circuitry, analog circuitry, digital circuitry, or component.

8. An apparatus comprising:
a current source to:
provide current to a load; and
in response to a resistance of the load being below a threshold, enter into a saturation mode;
a transistor coupled to the current source and adapted to be coupled to the load, the transistor to enter into triode mode, in response to the resistance of the load being below the threshold; and
a logic gate including an input coupled to the current source and the transistor, the logic gate to output a first voltage corresponding to at least one of a current at the input or a second voltage at the input.

9. The apparatus of claim 8, wherein the second voltage at the input is below a voltage threshold than the first voltage in response to (a) the current source is operating in the saturation mode and (b) the transistor is operating in the triode mode.

10. The apparatus of claim 8, wherein the logic gate is to output the second voltage as a voltage above a voltage threshold in response to the second voltage at the input being below the voltage threshold.

11. The apparatus of claim 8, wherein the current is a first current and, in response to the resistance of the load being below the threshold, a second current need from the transistor to satisfy an output voltage of the load is higher than the first current supplied by the current source.

12. The apparatus of claim 8, wherein the threshold is a first threshold and, in response to the resistance of the load being above a second threshold, the current source enters into the triode mode, and the transistor enters into the saturation mode.

13. The apparatus of claim 12, wherein the current is a first current and, in response to the resistance of the load being above the second threshold, a second current need from the transistor to satisfy an output voltage of the load is lower than the first current supplied by the current source.

14. The apparatus of claim 8, wherein the second voltage at the input is above a voltage threshold in response to (a) the current source is operating in the triode mode and (b) the transistor is in the saturation mode.

15. The apparatus of claim 14, wherein the logic gate is to output the first voltage as a voltage lower than the voltage threshold in response to the second voltage at the input being above the voltage threshold.

16. The apparatus of claim 8, wherein the transistor is a first transistor, further including a second transistor to cap an output voltage of the load.

17. The apparatus of claim 16, further including a third transistor to bias a control terminal of the second transistor.

18. The apparatus of claim 8, wherein the transistor is a first transistor, further including a second transistor to bias a control terminal of the first transistor.

19. A termination detection circuit adapted to be coupled to a load and operable to determine whether a resistance of the load is above or below a threshold, the termination detection circuit comprising:
a first current source having a first terminal adapted to be coupled to a voltage supply and having a second terminal;
a second current source having a third terminal adapted to be coupled to the voltage supply and having a fourth terminal;
a third current source having a fifth terminal adapted to be coupled to the voltage supply and having a sixth terminal;
a first transistor having a first control terminal, a first current terminal coupled to the second terminal and an output terminal and having a second current terminal adapted to be coupled to the load;
a second transistor having a second control terminal, a third current terminal coupled to the second current terminal and having a fourth current terminal coupled to ground;
a third transistor having a third control terminal coupled to the first control terminal, a fifth current terminal coupled to the sixth terminal and to the third control terminal and having a sixth current terminal adapted to be coupled to a reference voltage; and
a fourth transistor having a fourth control terminal coupled to the second control terminal, a seventh current terminal coupled to the fourth terminal and the fourth control terminal and having an eighth current terminal coupled to ground.

* * * * *